United States Patent
Lin et al.

(10) Patent No.: US 8,520,793 B2
(45) Date of Patent: Aug. 27, 2013

(54) PHASE DETECTOR, PHASE DETECTING METHOD, AND CLOCK-AND-DATA RECOVERY DEVICE

(75) Inventors: Chun-Cheng Lin, Tainan (TW); Ming-Shih Yu, New Taipei (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 302 days.

(21) Appl. No.: 13/090,272

(22) Filed: Apr. 20, 2011

(65) Prior Publication Data
US 2012/0269243 A1    Oct. 25, 2012

(51) Int. Cl.
*H03D 3/24*    (2006.01)

(52) U.S. Cl.
USPC ........... 375/375; 375/224; 375/371; 375/376; 375/373

(58) Field of Classification Search
USPC ...................... 375/224, 375, 376, 371, 373
See application file for complete search history.

(56) References Cited

U.S. PATENT DOCUMENTS

| | | | | |
|---|---|---|---|---|
| 4,663,769 A * | 5/1987 | Krinock | | 375/359 |
| 5,126,602 A * | 6/1992 | Lee et al. | | 327/10 |
| 5,652,531 A * | 7/1997 | Co et al. | | 327/12 |
| 5,850,422 A * | 12/1998 | Chen | | 375/371 |
| 5,920,600 A * | 7/1999 | Yamaoka et al. | | 375/376 |
| 6,347,128 B1* | 2/2002 | Ransijn | | 375/376 |
| 6,577,694 B1* | 6/2003 | Meghelli | | 375/373 |
| 6,628,173 B2* | 9/2003 | Cohen et al. | | 331/25 |
| 7,027,544 B2* | 4/2006 | Vaucher | | 375/355 |
| 7,609,102 B2* | 10/2009 | Shanbhag et al. | | 327/231 |
| 7,873,132 B2* | 1/2011 | Desai | | 375/376 |
| 8,315,349 B2* | 11/2012 | Badalone | | 375/376 |

* cited by examiner

*Primary Examiner* — Kenneth Lam
(74) *Attorney, Agent, or Firm* — Winston Hsu; Scott Margo (57) ABSTRACT

A phase detector includes a first sampling unit, a sampling module and a phase determining module. The first sampling unit is arranged for sampling a first data input signal to generate a first data signal according to a first clock signal. The sampling module includes a second sampling unit and a third sampling unit. The second sampling unit is arranged for sampling a second data input signal to generate a second data signal according to a second clock signal. The third sampling unit is arranged for sampling the second data signal to generate a third data signal according to the first clock signal. The phase determining module is arranged for generating a phase detecting result according to the first data signal and the third data signal.

26 Claims, 13 Drawing Sheets

PHASE DETECTOR, PHASE DETECTING METHOD, AND CLOCK-AND-DATA RECOVERY DEVICE

BACKGROUND OF THE INVENTION

1. Field of the Invention

The present disclosure relates to a phase detecting method, a phase detector, and a related clock-and-data recovery device, and more particularly, to a phase detecting method, a phase detector, and a related clock-and-data recovery device for utilizing two clock signals to sample the data input signal(s) for two times.

2. Description of the Prior Art

A phase detector is one of the most important device in signal processing systems, and has been widely used in numerous different applications, such as communication devices, server controllers, and phase lock loops (PLLs).

Generally speaking, the phase detector usually utilizes a plurality of clock signals to sample the input data signal(s). However, there is usually a phase shift existed between the plurality of clock signals, respectively. For example, there is a phase shift of 90 degrees existed between a clock signal CK0 and a clock signal CK90. For this reason, when the plurality of clock signals are adopted to sample the same input data signal, the problems of phase errors existed between two sampled data may be occurred, which may cause errors on phase detections. Hence, how to prevent the problems resulted from the phase errors become one of the important topics in this field.

SUMMARY OF THE INVENTION

It is therefore one of the objectives of the present disclosure to provide a phase detecting method, a phase detector, and a related clock-and-data recovery device for utilizing two clock signals to sample the data input signal(s) for two times to solve the above-mentioned problems of phase errors.

According to one aspect of the present disclosure, an exemplary phase detector is provided. The phase detector may include a first sampling unit, a sampling module, and a phase determining module. The first sampling unit is arranged for sampling a first data input signal to generate a first data signal according to a first clock signal. The sampling module may include a second sampling unit and a third sampling unit. The second sampling unit is arranged for sampling a second data input signal to generate a second data signal according to a second clock signal. The third sampling unit is coupled to the second sampling unit, and is arranged for sampling the second data signal to generate a third data signal according to the first clock signal. The phase determining module is coupled to the first sampling unit and the third sampling unit, and is arranged for generating a phase detecting result according to the first data signal and the third data signal.

According to another aspect of the present disclosure, an exemplary phase detecting method is provided. The phase detecting method may include the following steps: sampling a first data input signal to generate a first data signal according to a first clock signal; sampling a second data input signal to generate a second data signal according to a second clock signal; sampling the second data signal to generate a third data signal according to the first clock signal; and generating a phase detecting result according to the first data signal and the third data signal.

According to still another aspect of the present disclosure, an exemplary clock-and-data recovery device is provided. The clock-and-data recovery device may include a phase detector, a charge pump, a loop filter, and a controlled oscillator. The phase detector may include a first sampling unit, a sampling module, and a phase determining module. The first sampling unit is arranged for sampling a first data input signal to generate a first data signal according to a first clock signal. The sampling module may include a second sampling unit and a third sampling unit. The second sampling unit is arranged for sampling a second data input signal to generate a second data signal according to a second clock signal. The third sampling unit is coupled to the second sampling unit, and is arranged for sampling the second data signal to generate a third data signal according to the first clock signal. The phase determining module is coupled to the first sampling unit and the third sampling unit, and is arranged for generating a phase detecting result according to the first data signal and the third data signal. The charge pump is coupled to the phase detector, and is arranged for generating a charge control signal according to the phase detecting result. The loop filter is coupled to the charge pump, and is arranged for generating an oscillator control signal according to the charge control signal. The controlled oscillator is coupled to the charge pump and the loop filter, and is arranged for receiving the oscillator control signal, for compensating a plurality of frequencies of the first clock signal and the second clock signal, and for outputting a compensated first clock signal and a compensated second clock signal.

Compared with the prior art, by adopting the phase detector, the clock-and-data recovery device and related method of the present disclosure, not only can the problems of phase errors existed between clock signals be solved, but also the sampling edge of the clock signal(s) can be aligned to the center of the data input signal so as to obtain accurate sampled data.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
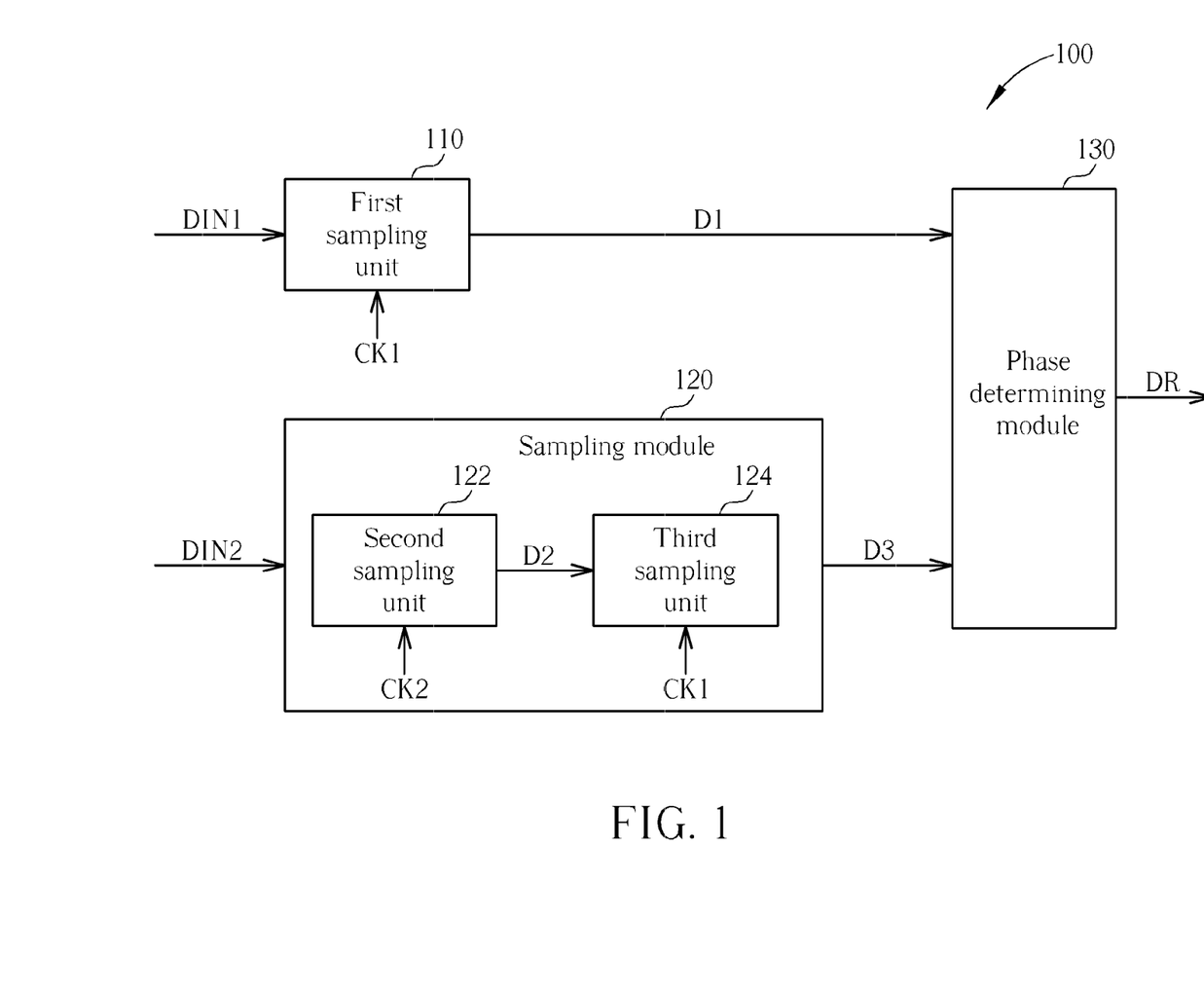
FIG. 1 is a diagram of a phase detector according to a first embodiment of the present disclosure.

Please refer to FIG. 1. FIG. 1 is a diagram of a phase detector according to a first embodiment of the present disclosure. As shown in FIG. 1, the phase detector 100 may include, but is not limited to, a first sampling unit 110, a sampling module 120, and a phase determining module 130. The first sampling unit 110 is arranged for sampling a first data input signal DIN1 to generate a first data signal D1 according to a first clock signal CK1. The sampling module 120 may include a second sampling unit 122 and a third sampling unit 124, wherein the second sampling unit 122 is arranged for sampling a second data input signal DIN2 to generate a second data signal D2 according to a second clock signal CK2, and the third sampling unit 124 is coupled to the second sampling unit 122 and is arranged for sampling the second data signal D2 to generate a third data signal D3 according to the first clock signal CK1. The phase determining module 130 is coupled to the first sampling unit 110 and the third sampling unit 124, and is arranged for generating a phase detecting result DR according to the first data signal D1 and the third data signal D3. Please note that: the first data input signal DIN1 and the second data input signal DIN2 can be an identical data input signal, but this in no way should be considered as a limitation of the present disclosure. In other embodiments of the present disclosure, the first data input signal DIN1 and the second data input signal DIN2 can be a differential signal pair. Furthermore, in one embodiment of the present disclosure, each of the first sampling unit 110, the second sampling unit 122, and the third sampling unit 124 may be implemented by a flip-flop, but the present disclosure is not limited to this only. In addition, in order to work with the flip-flop(s) mentioned above, the phase determining module 130 may be implemented by an exclusive OR (XOR) gate for performing an XOR logic operation upon the first data signal D1 and the third data signal D3 so as to generate the phase detecting result DR. Be noted that: the phase detecting result DR may indicate a determining result of determining an advance of time or a delay of time for performing a backward amendment or forward amendment upon the first clock signal CK1 and the second clock signal CK2, such that the sampling edge of the first clock signal CK1 and the second clock signal Ck2 can be assured to be aligned to the center or the transition of the data input signal DIN1 and the second data input signal DIN2 in order to obtain accurate sampled data. The functions and operations of the abovementioned XOR gate and the flip-flops will be detailed in the following embodiments.

Figure 2:
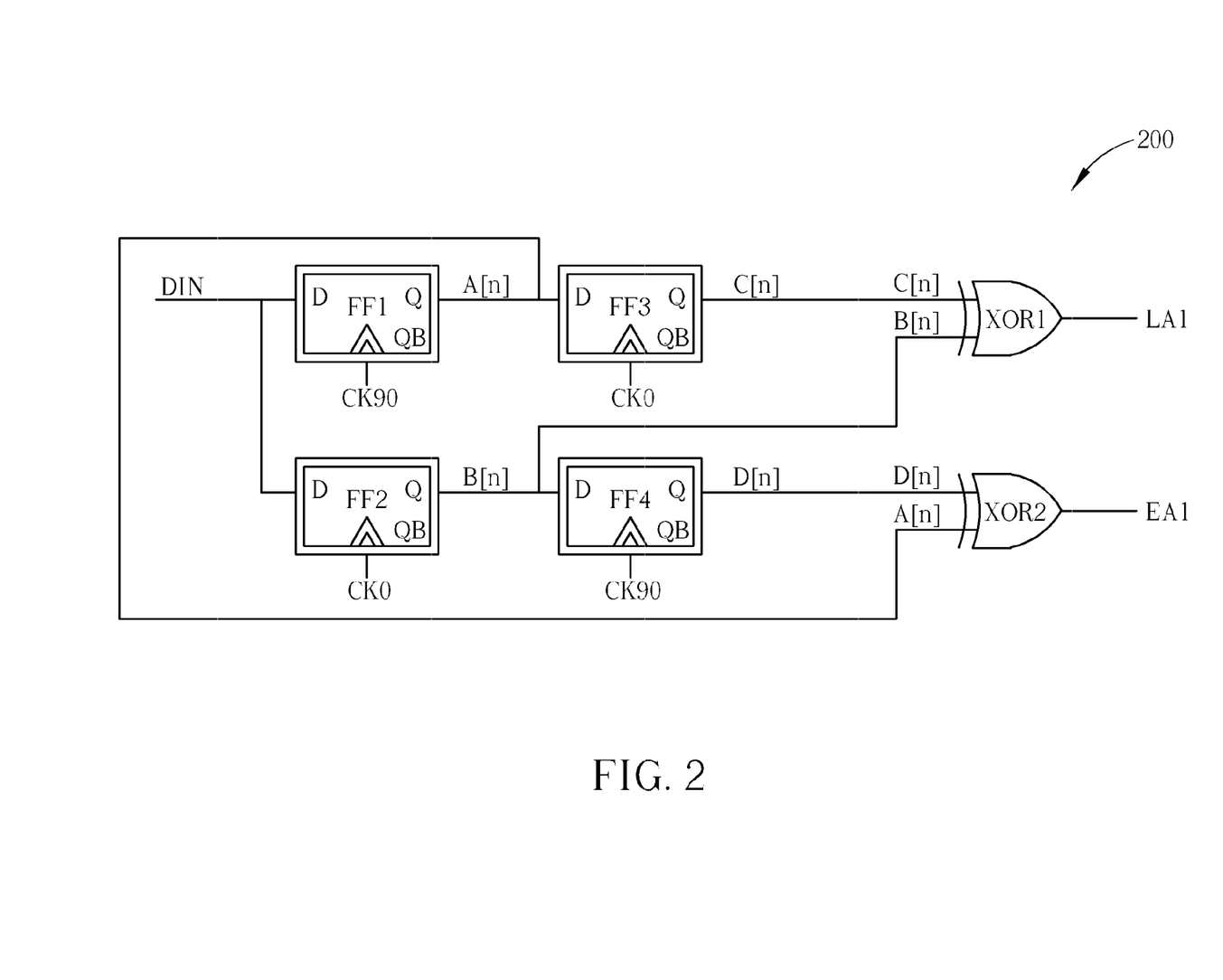
FIG. 2 is a diagram of a phase detector according to a second embodiment of the present disclosure.
Figure 3:
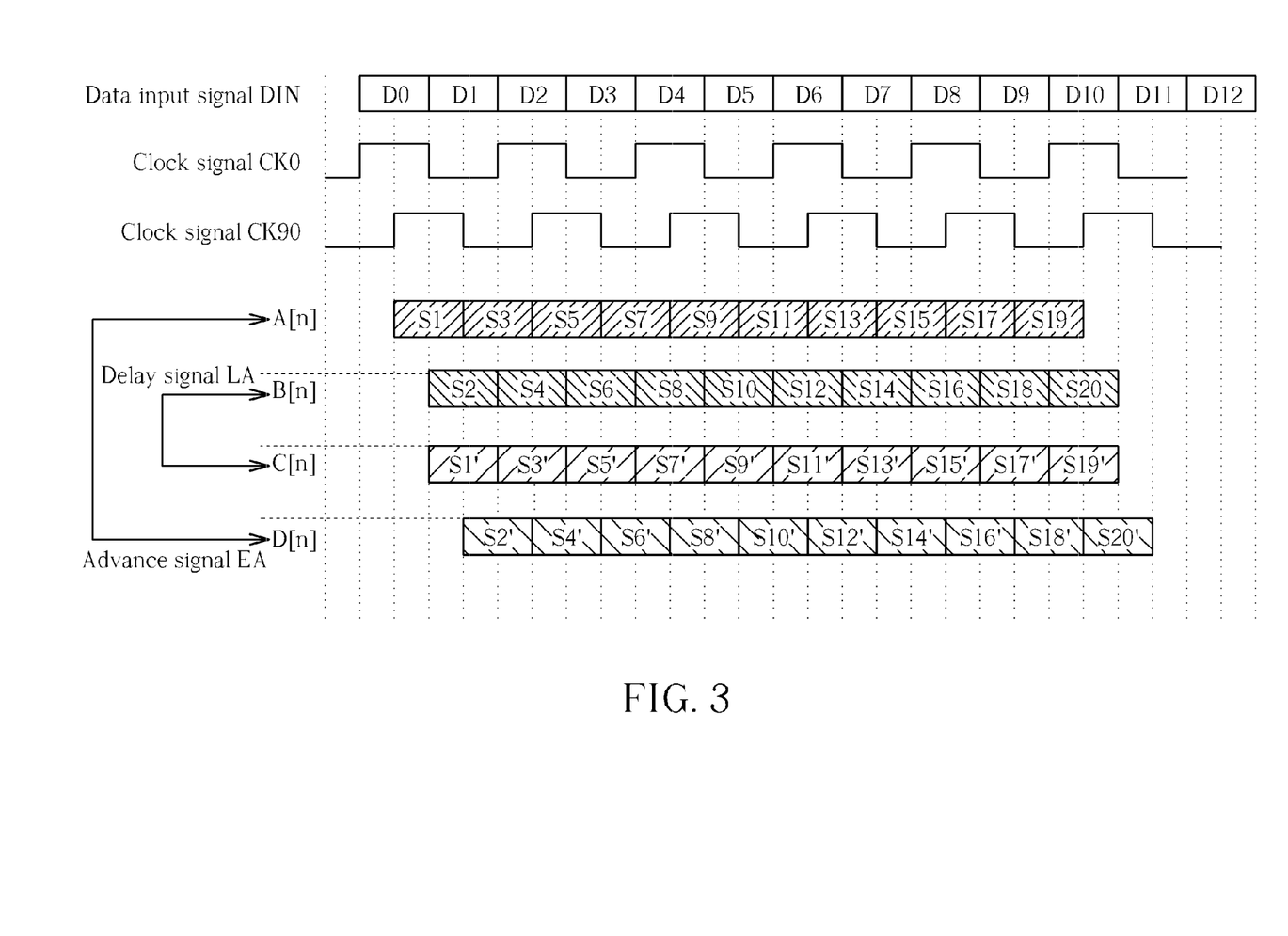
FIG. 3 is a diagram illustrating how the phase detector shown in FIG. 2 samples the data input signal.
Figure 4:
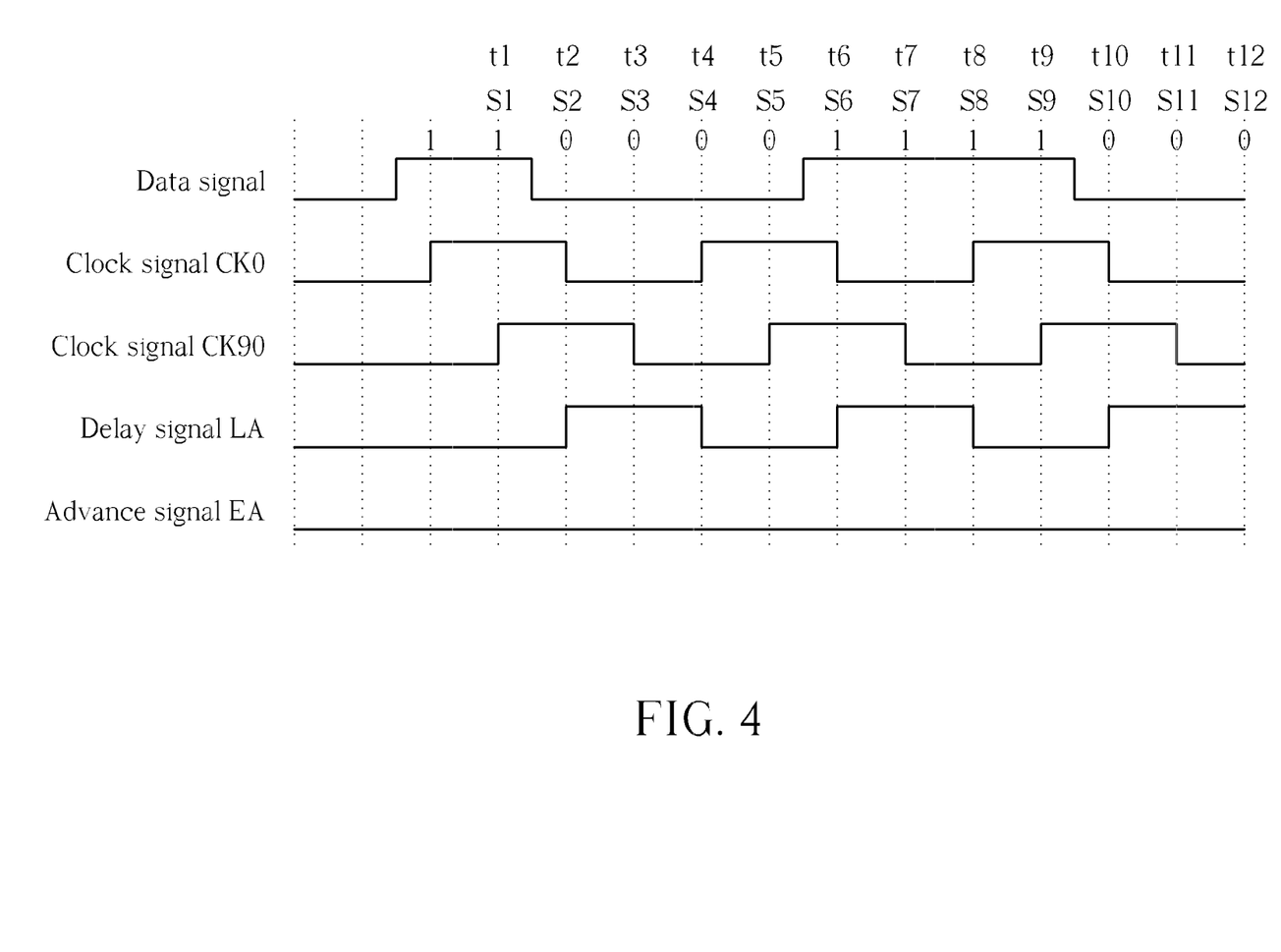
FIG. 4 is a signal timing diagram of the phase detector shown in FIG. 2.

Please refer to FIG. 2, FIG. 3, together with FIG. 4. FIG. 2 is a diagram of a phase detector 200 according to a second embodiment of the present disclosure; FIG. 3 is a diagram illustrating how the phase detector 200 shown in FIG. 2 samples the data input signal; and FIG. 4 is a signal timing diagram of the phase detector 200 shown in FIG. 2. In this embodiment, the first data input signal DIN1 and the second data input signal DIN2 are implemented by using the same data input signal DIN. As shown in FIG. 2, the phase detector 200 may include, but is not limited to, a first flip-flop FF1, a second flip-flop FF2, a third flip-flop FF3, a fourth flip-flop FF4, a first exclusive OR gate XOR1, and a second exclusive OR gate XOR2. Please note that: in this embodiment, there is a phase shift of 90 degrees existed between the clock signal CK90 and the clock signal CK0.

Please refer to FIG. 1 together with FIG. 2. During a stage of determining an advance signal EA1, the first flip-flop FF1 is acted as the first sampling unit 110, the second flip-flop FF2 is acted as the second sampling unit 122, the fourth flip-flop FF4 is acted as the third sampling unit 124, the clock signal CK90 is acted as the first clock signal Ck1, the clock signal CK0 is acted as the second clock signal CK2, and the second exclusive OR gate XOR2 is acted as the phase determining module 130 for generating the phase detecting result DR. At this time, the phase detecting result DR indicates a determining result of determining an advance of time. Similarly, during a stage of determining a delay signal LA1, the second flip-flop FF2 is acted as the first sampling unit 110, the first flip-flop FF1 is acted as the second sampling unit 122, the third flip-flop FF3 is acted as the third sampling unit 124, the clock signal CK0 is acted as the first clock signal Ck1, the clock signal Ck90 is acted as the second clock signal CK2, and the first exclusive OR gate XOR1 is acted as the phase determining module 130 for generating the phase detecting result DR. At this time, the phase detecting result DR indicates a determining result of determining a delay of time.

Please refer to FIG. 3 again. As shown in FIG. 3, the data input signal DIN may include data D0~D12, however, this is presented merely to illustrate practicable designs of the present disclosure, and should be considered to be limitations of the scope of the present disclosure. The first flip-flop FF1 can perform sampling operations upon the data input signal DIN according to the clock signal CK90 so as to generate a sampled data sequence A[n], wherein the sampled data sequence A[n] may include a plurality of data signals, such as S1, S3, S5, . . . , and S19. The second flip-flop FF2 can perform sampling operations upon the data input signal DIN according to the clock signal CK0 so as to generate another sampled data sequence B[n], wherein the sampled data sequence B[n] may include a plurality of data signals, such as, S2, S4, S6, . . . , and S20. The third flip-flop FF3 can perform sampling operations upon the sampled data sequence A[n] according to the clock signal CK0 so as to generate a sampled data sequence C[n]. That is to say, the third flip-flop FF3 can resample the plurality of data signals, such as S1, S3, S5, . . . , and S19, of the sampled data sequence A[n] in order to generate a plurality of re-sampled data signals, such as S1', S3', S5', . . . , and S19'. In addition, the fourth flip-flop FF4 can perform sampling operations upon the sampled data sequence B[n] according to the clock signal CK90 so as to generate a sampled data sequence D[n]. Similarly, the fourth flip-flop FF4 can resample the plurality of data signals, such as S2, S4, S6, . . . , and S20, of the sampled data sequence B[n] in order to generate a plurality of re-sampled data signals, such as, S2', S4', S6', . . . , and S20'. After that, the first exclusive OR gate XOR1 may generate the delay signal LA1 according to the data signals of the sampled data sequence B[n] and the sampled data sequence C[n]. For example, when the data signal of the sampled data sequence B[n] has a logic level of "0" and the data signal of the sampled data sequence C[n] has a logic level of "1", the resultant delay signal LA1 generated by the first exclusive OR gate OXR1 has a logic level of "1". Under this condition, the phase detecting result DR indicates a determining result that the clock signal CK0 falls behind the data input signal DIN, that is to say, there is a delay of time (i.e., a rightward shift) occurred at the sampling edge of the clock signal CK0. Similarly, when the data signal of the sampled data sequence A[n] has a logic level of "1" and the data signal of the sampled data sequence D[n] has a logic level of "0", the resultant advance signal EA1 generated by the second exclusive OR gate XOR2 has a logic level of "0". Under this condition, the phase detecting result DR indicates a determining result that the clock signal CK0 is ahead of the data input signal DIN, that is to say, there is an advance of time (i.e., a leftward shift) occurred at the sampling edge of the clock signal CK0.

Since the second flip-flop FF2 and the third flip-flop FF3 adopt the same clock signal CK0 to perform sampling operations, the data signal S2 of the sampled data sequence B[n] and the data signal S1' of the sampled data sequence C[n] are in phase. As a result, the problem of phase errors existed between the sampled data sequence B[n] and the sampled data sequence A[n] be solved. Similarly, since the first flip-flop FF1 and the fourth flip-flop FF4 adopt the same clock signal CK90 to perform sampling operations, the data signal S3 of the sampled data sequence A[n] and the data signal S2' of the sampled data sequence D[n] are in phase. As a result, the problem of phase errors existed between the sampled data sequence A[n] and the sampled data sequence B[n] be solved, as well.

Please refer to FIG. 4. As shown in FIG. 4, as far as the delay signal LA is concerned, at the timing t2, by reference to the data signal S2 (with a logic level of "0") of the sampled data sequence B[n] and the data signal S1 (with a logic level of "1") of the sampled data sequence C[n], the resultant phase detecting result DR generated by the first exclusive OR gate XOR1 has a logic level of "1". It indicates that the clock signal CK0 falls behind the data input signal DIN, that is to say, there is a delay of time (i.e., a rightward shift) occurred at the sampling edge of the clock signal CK0. At the timing t4, by reference to the data signal S4 (with a logic level of "0") of the sampled data sequence B[n] and the data signal S3 (with a logic level of "0") of the sampled data sequence C[n], the resultant phase detecting result DR generated by the first exclusive OR gate XOR1 has a logic level of "0". Similarly, at the timing t6, by reference to the data signal S6 (with a logic level of "1") of the sampled data sequence B[n] and the data signal S5 (with a logic level of "0") of the sampled data sequence C[n], the resultant phase detecting result DR generated by the first exclusive OR gate XOR1 has a logic level of "1".

On the other hand, as far as the advance signal EA1 is concerned, at the timing t3, by reference to the data signal S2 (with a logic level of "0") of the sampled data sequence A[n] and the data signal S3 (with a logic level of "0") of the sampled data sequence D[n], the resultant phase detecting result DR generated by the second exclusive OR gate XOR2 has a logic level of "0". It indicates that the clock signal CK0 is not ahead of the data input signal DIN, that is to say, there is no advance of time (i.e., a leftward shift) occurred at the sampling edge of the clock signal CK0.

Figure 5:
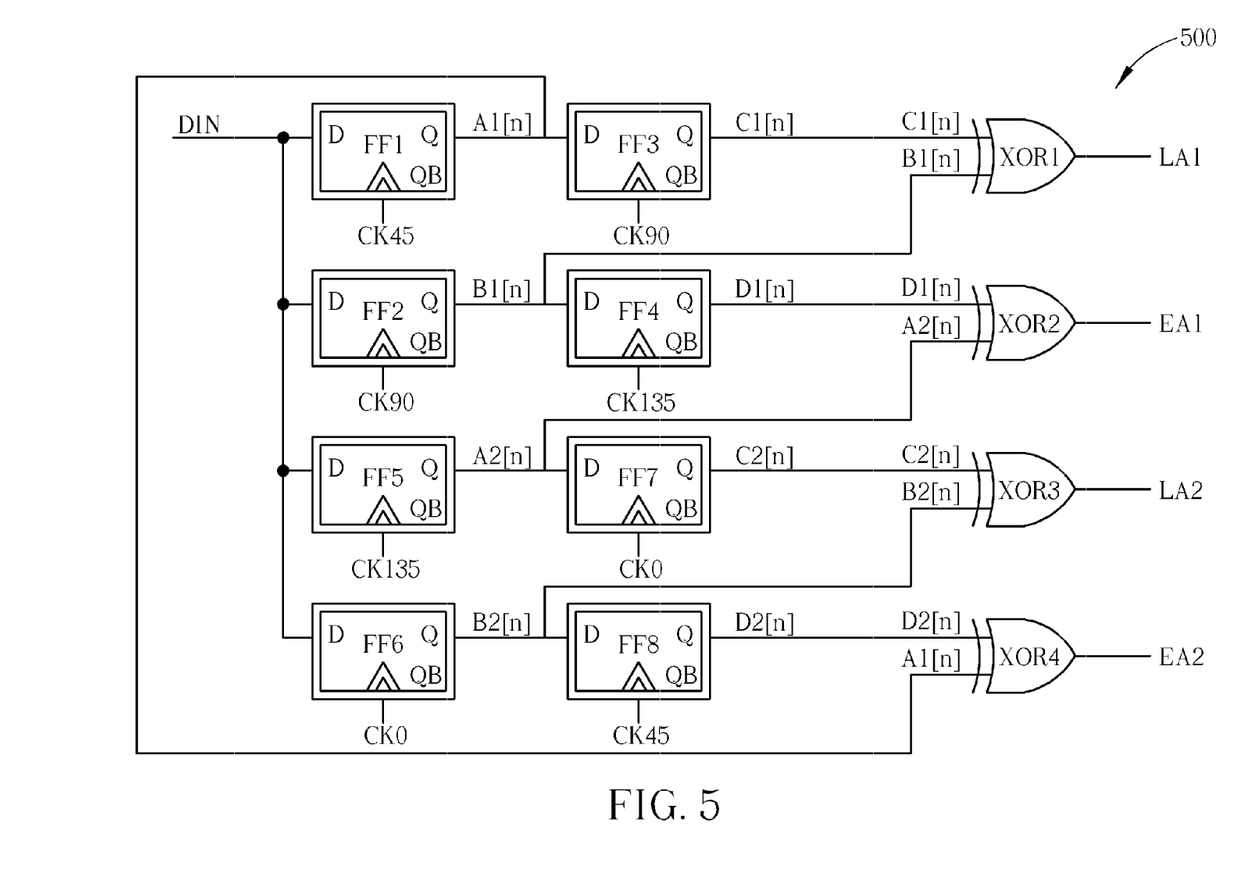
FIG. 5 is a diagram of a phase detector according to a third embodiment of the present disclosure.
Figure 6:
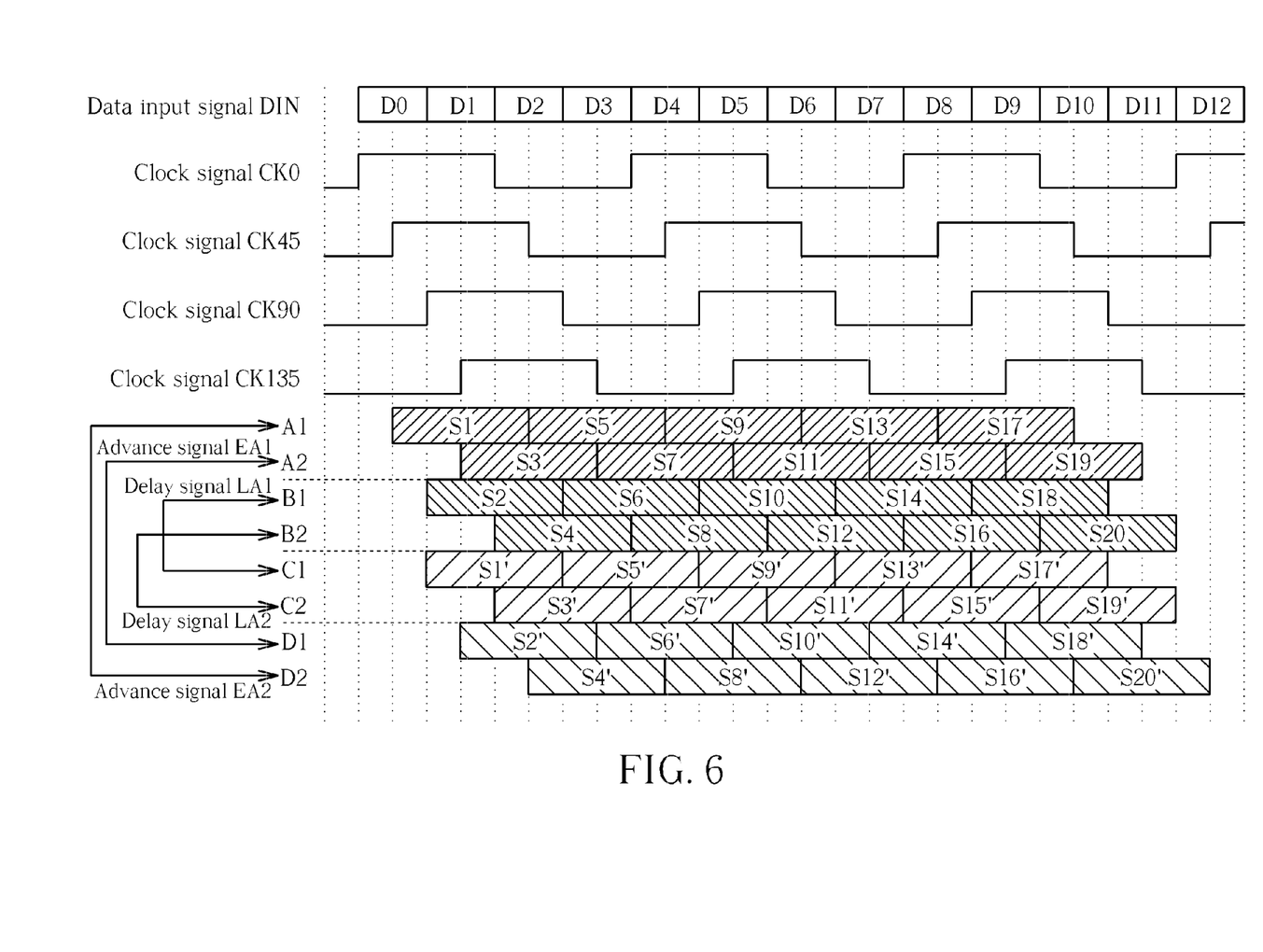
FIG. 6 is a diagram illustrating how the phase detector shown in FIG. 5 samples the data input signal.
Figure 7:
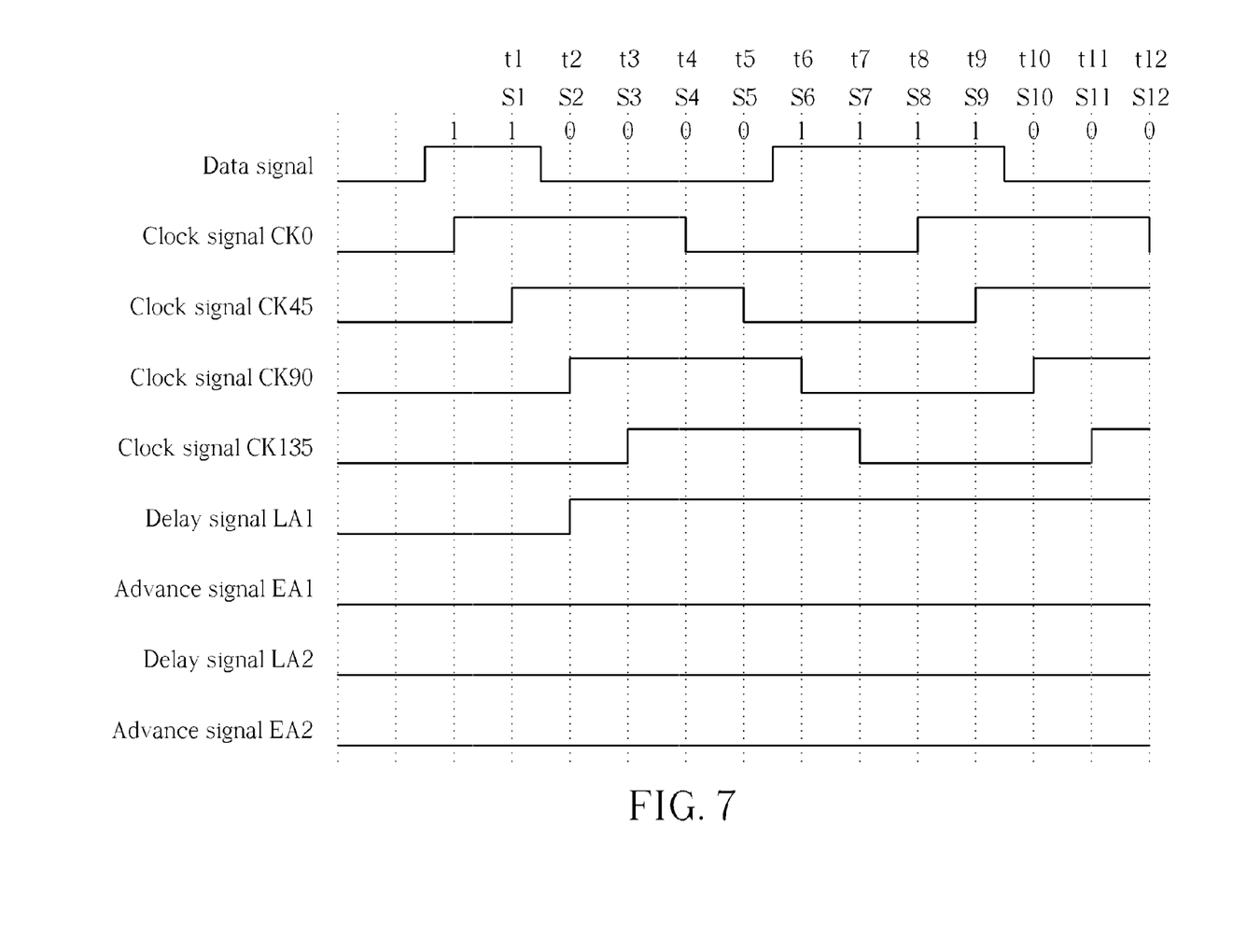
FIG. 7 is a signal timing diagram of the phase detector shown in FIG. 5.

Please refer to FIG. 5, FIG. 6, together with FIG. 7. FIG. 5 is a diagram of a phase detector 500 according to a third embodiment of the present disclosure; FIG. 6 is a diagram illustrating how the phase detector 500 shown in FIG. 5 samples the data input signal; and FIG. 7 is a signal timing diagram of the phase detector 500 shown in FIG. 5. The architecture of the phase detector 500 shown in FIG. 5 is similar to that of the phase detector 200 shown in FIG. 2, and the difference between them is that: there is a phase shift of 45 degrees existed between the clock signal CK0, the clock signal CK45, the clock signal CK90, and the clock signal CK135. As shown in FIG. 5, the phase detector 500 may include, but is not limited to, a first flip-flop FF1, a second flip-flop FF2, a third flip-flop FF3, a fourth flip-flop FF4, a fifth flip-flop FF5, a sixth flip-flop FF6, a seventh flip-flop FF7, an eighth flip-flop FF8, a first exclusive OR gate XOR1, a second exclusive OR gate XOR2, a third exclusive OR gate XOR3, and a fourth exclusive OR gate XOR4. Since the operations of the phase detector 500 shown in FIG. 5 are similar to that of the phase detector 200 shown in FIG. 2, those skilled in the art can easily understand detailed features related to the elements of the phase detector 500 shown in FIG. 5, the operating method for sampling data shown in FIG. 6, and the signal timing shown in FIG. 7 according to the abovementioned descriptions of the phase detector 100 shown in FIG. 1 and the phase detector 200 shown in FIG. 2, and further description is omitted here for brevity. What calls for special attention is that: the first exclusive OR gate XOR1 may generate the delay signal LA1 according to the data signals of the sampled data sequence B1[n] and the sampled data sequence C1[n]. At this time, the clock signal CK90 is acted as the first clock signal CK1 and the clock signal CK45 is acted as the second clock signal CK2. The second exclusive OR gate XOR2 may generate the advance signal EA1 according to the data signals of the sampled data sequence D1[n] and the sampled data sequence A2[n]. At this time, the clock signal CK135 is acted as the first clock signal CK1 and the clock signal CK90 is acted as the second clock signal CK2. The third exclusive OR gate XOR3 may generate the delay signal LA2 according to the data signals of the sampled data sequence B2[n] and the sampled data sequence C2[n]. At this time, the clock signal CK0 is acted as the first clock signal CK1 and the clock signal CK135 is acted as the second clock signal CK2. In addition, the fourth exclusive OR gate XOR4 may generate the advance signal EA2 according to the data signals of the sampled data sequence D2[n] and the sampled data sequence A1[n]. At this time, the clock signal CK45 is acted as the first clock signal CK1, and the clock signal CK0 is acted as the second clock signal CK2.

Figure 8:
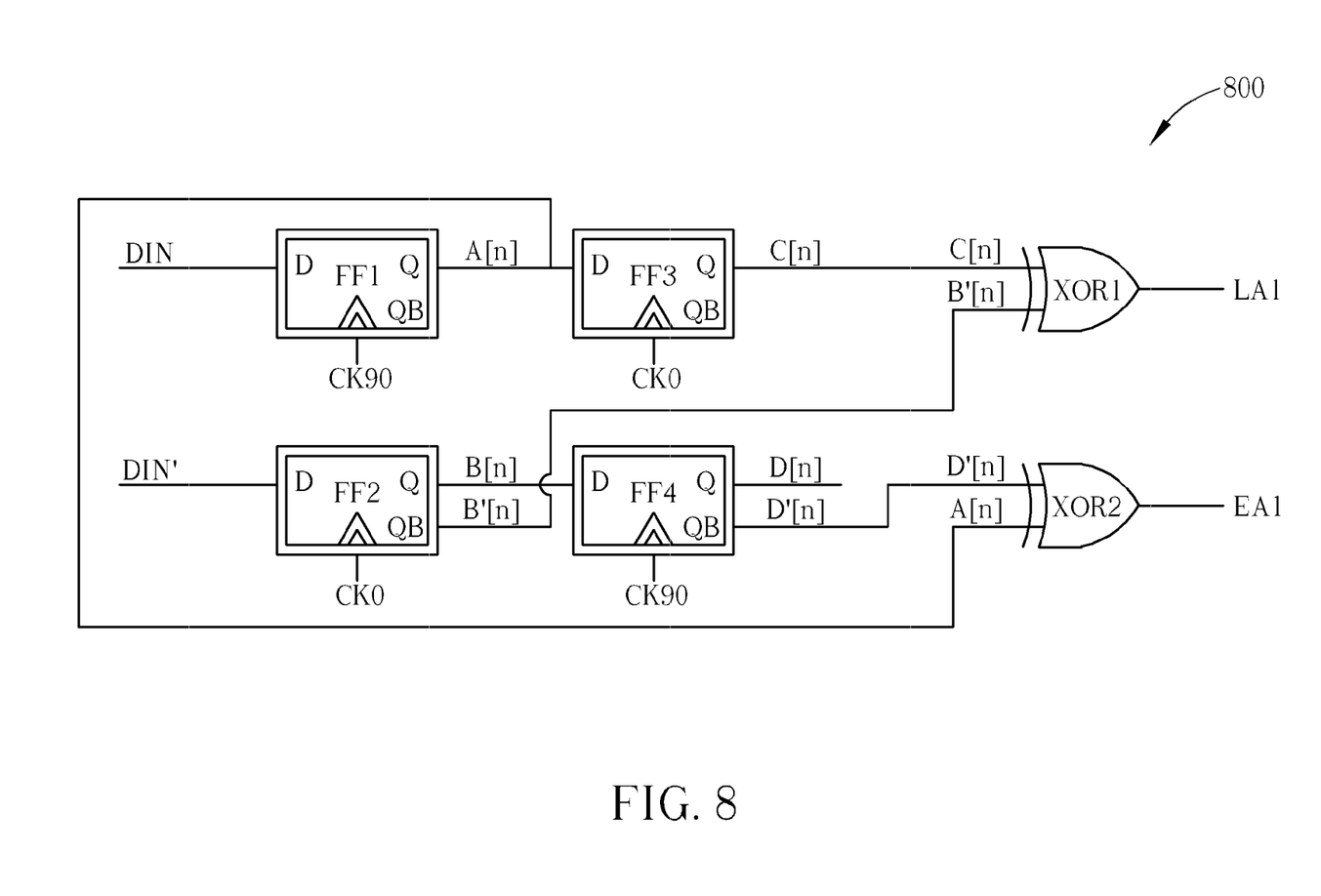
FIG. 8 is a diagram of a phase detector according to a fourth embodiment of the present disclosure.

Please refer to FIG. 8. FIG. 8 is a diagram of a phase detector 800 according to a fourth embodiment of the present disclosure. The architecture of the phase detector 800 shown in FIG. 8 is similar to that of the phase detector 200 shown in FIG. 2, and the difference between them is that: the first data input signal DIN and the second data input signal DIN' form a differential signal pair. As shown in FIG. 8, the first flip-flop FF1 can perform sampling operations upon the first data input signal DIN according to the clock signal CK90 so as to generate the sampled data sequence A[n]; the second flip-flop FF2 can perform sampling operations upon the second data input signal DIN' according to the clock signal CK0 so as to generate the sampled data sequence B[n] and the sampled data sequence B'[n]; the third flip-flop FF3 is coupled to the first flip-flop FF1, and is arranged for resampling the sampled data sequence A[n] according to the clock signal CK0 so as to generate the sampled data sequence C[n]; the fourth flip-flop FF4 is coupled to the second flip-flop FF2, and is arranged for resampling the sampled data sequence B[n] according to the clock signal CK90 so as to generate the sampled data sequence D[n] and the sampled data sequence D'[n]; the first exclusive OR gate XOR1 may generate the delay signal LA1 according to the data signals of the sampled data sequence B'[n] and the sampled data sequence C[n]; and the second exclusive OR gate XOR2 may generate the advance signal EA1 according to the sampled data sequence A[n] and the sampled data sequence D'[n]. What calls for special attention is that: in this embodiment, the first data input signal DIN and the second data input signal DIN' are a differential signal pair, and thus the loading of the data input signal of the phase detector 800 shown in FIG. 8 become one half of that of the phase detector 200 shown in FIG. 2.

Figure 9:
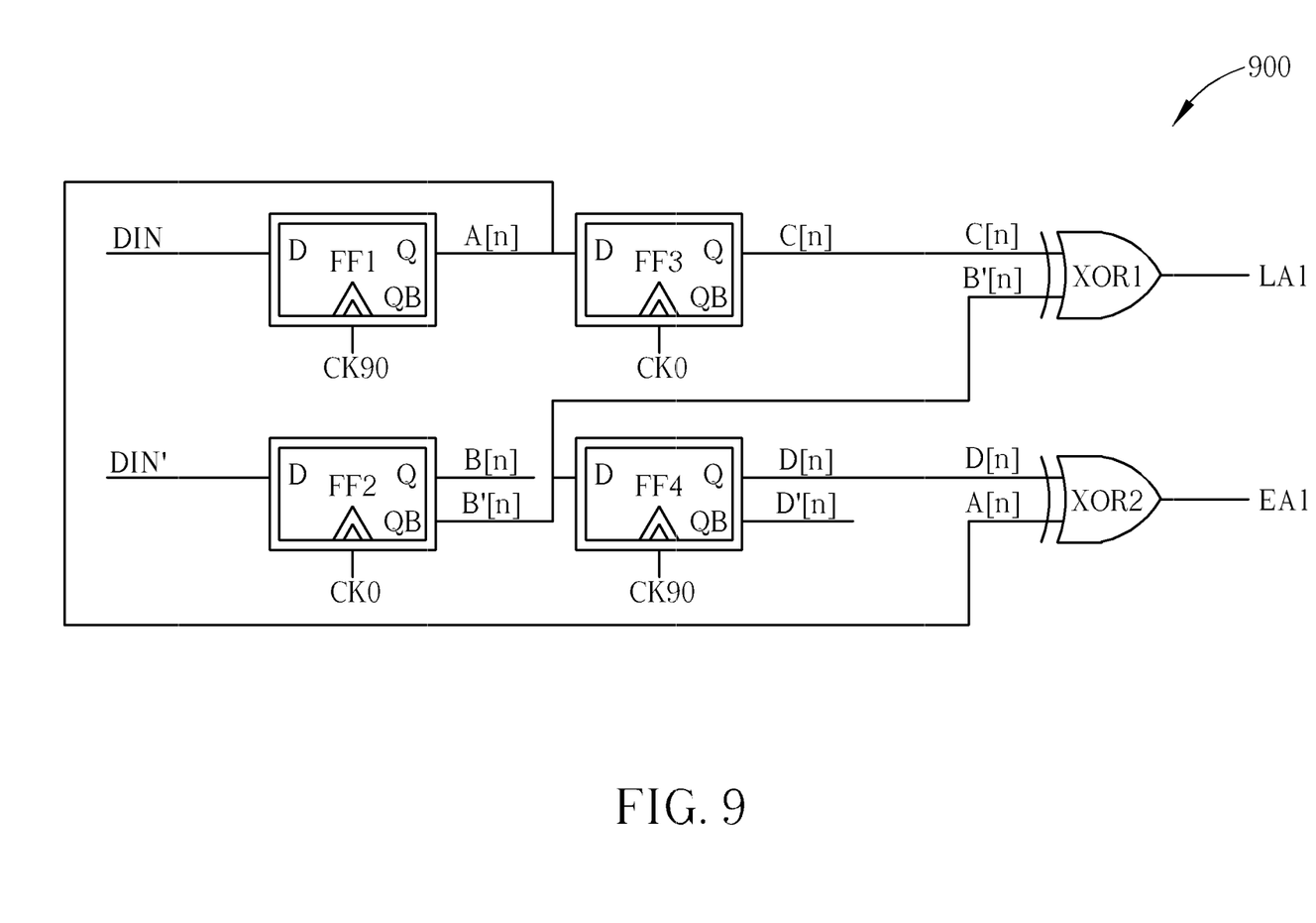
FIG. 9 is a diagram of a phase detector according to a fifth embodiment of the present disclosure.

Please refer to FIG. 9. FIG. 9 is a diagram of a phase detector 900 according to a fifth embodiment of the present disclosure. The architecture of the phase detector 900 shown in FIG. 9 is similar to that of the phase detector 800 shown in FIG. 8 and can be viewed as a varied embodiment of the phase detector 800 shown in FIG. 8, and the major difference between them is that: the fourth flip-flop FF4 of the phase detector 900 is coupled to an inverted output terminal of the second flip-flop FF2, and is arranged for resampling the sampled data sequence B'[n] according to the clock signal CK90 so as to generate the sampled data sequence D[n] and the sampled data sequence D'[n]. As a result, the first exclusive OR gate XOR1 may generate the delay signal LA1 according to the data signals of the sampled data sequence B'[n] and the sampled data sequence C[n], and the second exclusive OR gate XOR2 may generate the advance signal EA1 according to the data signals of the sampled data sequence A[n] and the sampled data sequence D[n].

Figure 10:
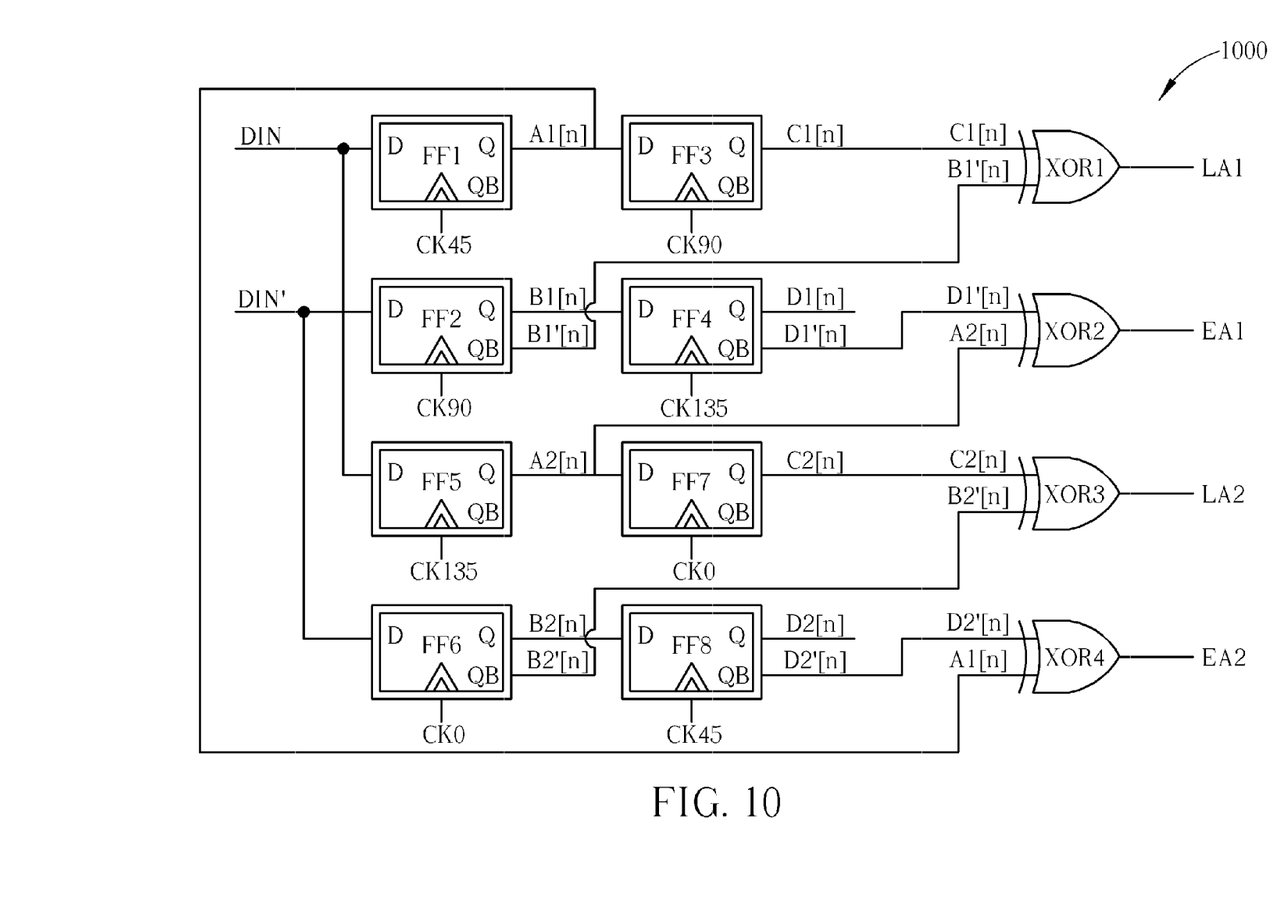
FIG. 10 is a diagram of a phase detector according to a sixth embodiment of the present disclosure.

Please refer to FIG. 10. FIG. 10 is a diagram of a phase detector 1000 according to a sixth embodiment of the present disclosure. The architecture of the phase detector 1000 shown in FIG. 10 is similar to that of the phase detector 500 shown in FIG. 5, and the difference between them is that: the first data input signal DIN and the second data input signal DIN' of the phase detector 1000 are a differential signal pair. Those skilled in the art can easily understand operations of the phase detector 1000 according to the abovementioned descriptions of the phase detector 500 shown in FIG. 5 and the phase detector 800 shown in FIG. 8, and further description is omitted here for brevity.

Figure 11:
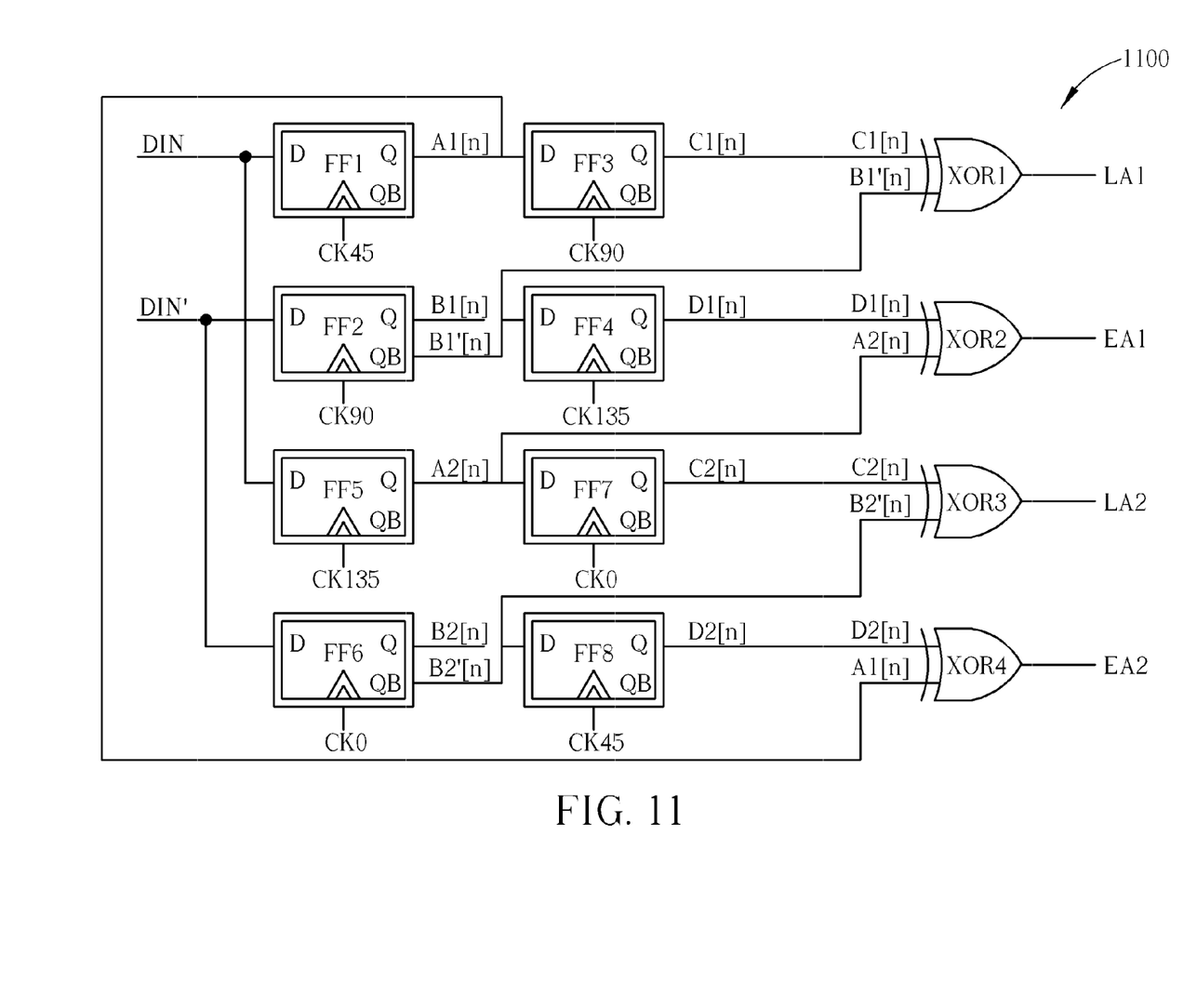
FIG. 11 is a diagram of a phase detector according to a seventh embodiment of the present disclosure.

Please refer to FIG. 11. FIG. 11 is a diagram of a phase detector 1100 according to a seventh embodiment of the present disclosure. The architecture of the phase detector 1100 shown in FIG. 11 is similar to that of the phase detector 1000 shown in FIG. 10, and the difference between them is that: the fourth flip-flop FF4 of the phase detector 1100 is coupled to an inverted output terminal of the second flip-flop FF2, and is arranged for resampling the sampled data sequence B1'[n] according to the clock signal CK135 so as to generate the sampled data sequence D1[n] and the sampled data sequence D1'[n]; and the eighth flip-flop FF8 is coupled to an inverted output terminal of the sixth flip-flop FF6, and is arranged for resampling the sampled data sequence B2'[n] according to the clock signal CK45 so as to generate the sampled data sequence D2[n] and the sampled data sequence D2'[n]. Those skilled in the art can easily understand operations of the phase detector 1100 according to the abovementioned descriptions of the phase detector 500 shown in FIG. 5 and the phase detector 900 shown in FIG. 9, and further description is omitted here for brevity.

Please note that: the abovementioned embodiments are presented merely to illustrate practicable designs of the present disclosure, and should be considered to be limitations of the scope of the present disclosure. The circuits in the abovementioned embodiments are implemented by connecting logic gates and flip-flops. Obviously, those skilled in the art should appreciate that: the same function can be implemented by applying combinations of different logic gates without departing from the spirit of the present disclosure. For example, one skilled in the art could simulate other circuits with the same function(s) through Boolean algebra operations, wherein these equivalent logic circuit designs also belong to the scope of the present disclosure.

Figure 12:
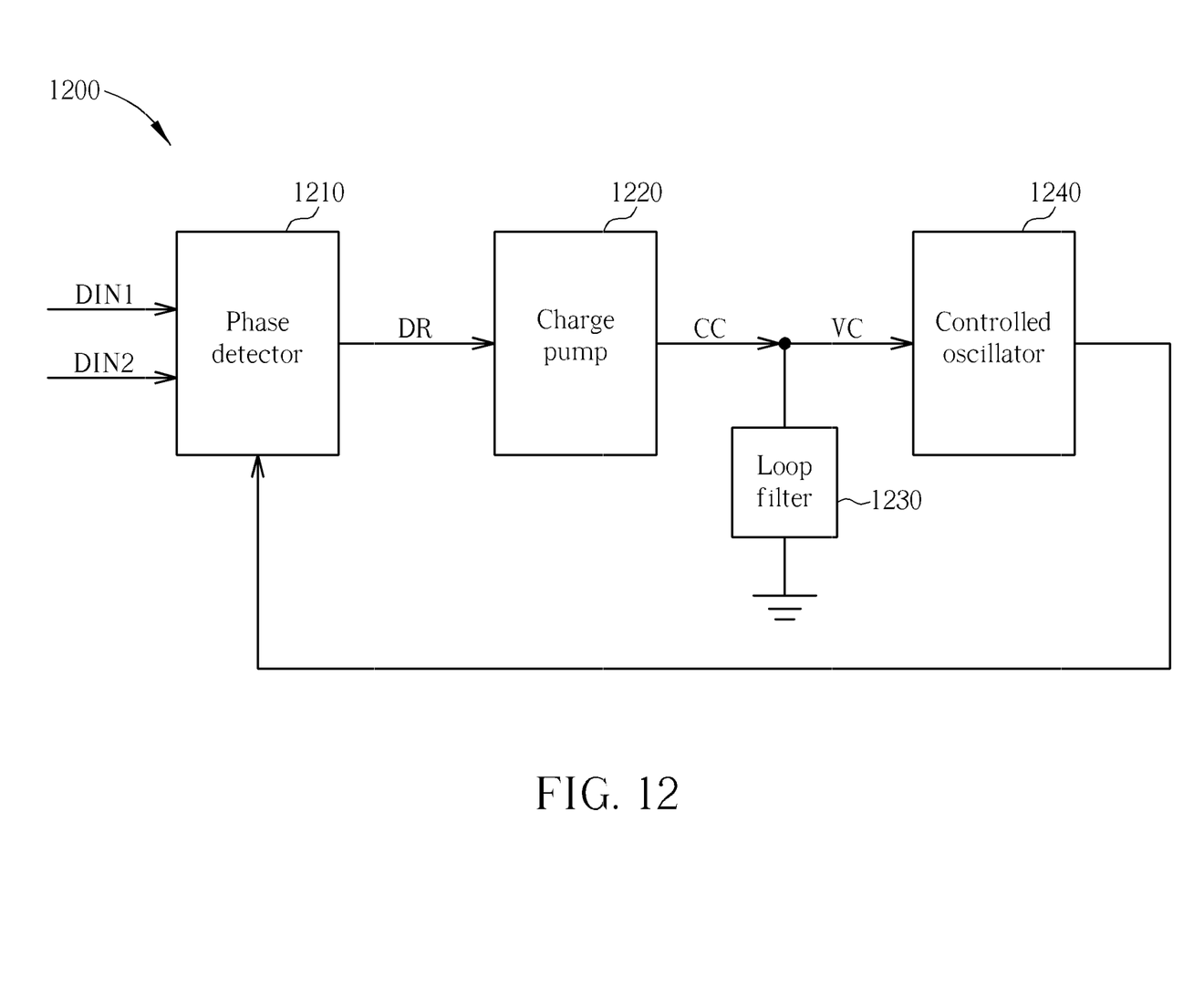
FIG. 12 is a block diagram of a clock-and-data recovery device according to an embodiment of the present disclosure.

Please refer to FIG. 12. FIG. 12 is a block diagram of a clock-and-data recovery device 1200 according to an embodiment of the present disclosure. As shown in FIG. 12, the clock-and-data recovery device 1200 may include a phase detector 1210, a charge pump 1220, a loop filter 1230, and a controlled oscillator 1240 (such as, a voltage controlled oscillator or oscillators of other types). The phase detector 1210 is arranged for sampling a first data input signal DIN1 and a second data input signal DIN2 according to a plurality of clock signals (such as, CK0, CK45, CK90, and CK135) so as to generate a phase detecting result DR. The charge pump 1220 is arranged for generating a charge control signal CC according to the phase detecting result DR. The loop filter 1230 is arranged for generating an oscillator control signal VC according to the charge control signal CC. The controlled oscillator 1240 is arranged for receiving the oscillator control signal VC, and for compensating a plurality of frequencies of these clock signals, and for outputting a plurality of compensated clock signals to the phase detector 1210. Please note that: as the operations of the clock-and-data recovery device 1200 are already well known to the industries in this field, and those skilled in the art can easily apply the abovementioned phase detectors 100, 200, 500, 800, 900, 100, and 1100 shown in FIG. 1, FIG. 2, FIG. 5, FIG. 8, FIG. 9, FIG. 10, and FIG. 11 to the clock-and-data recovery device 1200, and further description is omitted here for brevity.

Figure 13:
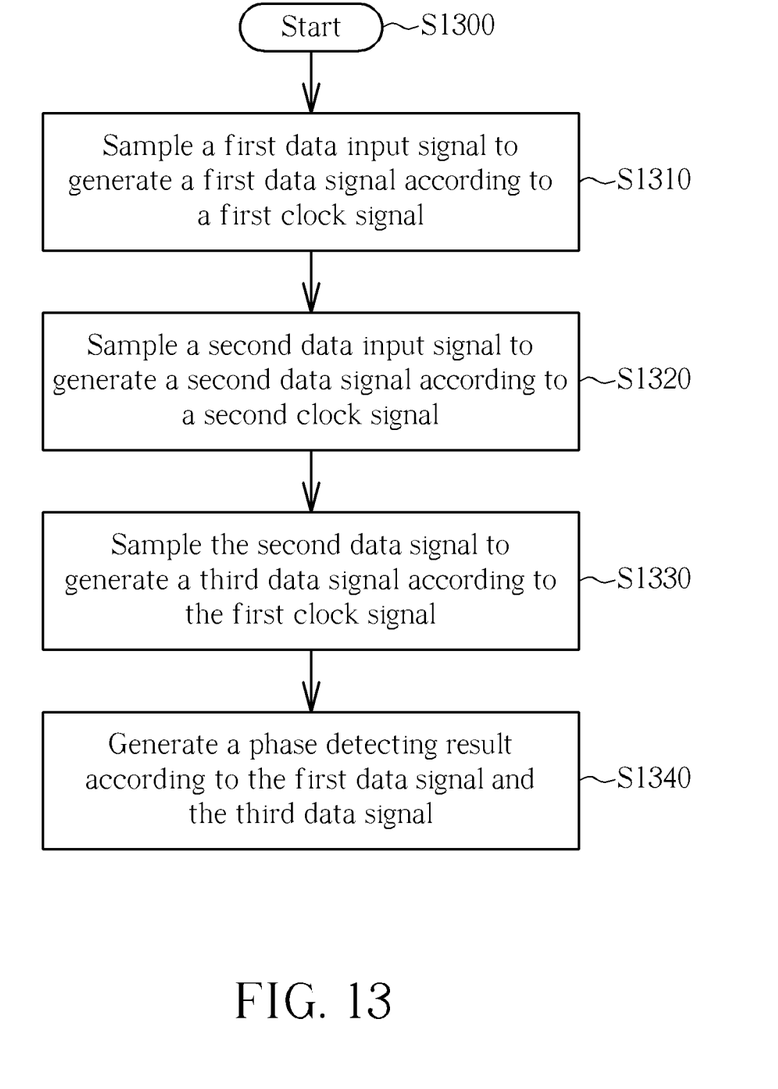
FIG. 13 is a flowchart illustrating a phase detecting method according to an exemplary embodiment of the present disclosure.

Please refer to FIG. 13. FIG. 13 is a flowchart illustrating a phase detecting method according to an exemplary embodiment of the present disclosure. The phase detecting method can be applied to the phase detectors mentioned in the embodiments above. Please note that the following steps are not limited to be performed according to the exact sequence shown in FIG. 13 if a roughly identical result can be obtained. The method includes, but is not limited to, the following steps:

Step S1300: Start.

Step S1310: Sample a first data input signal to generate a first data signal according to a first clock signal.

Step S1320: Sample a second data input signal to generate a second data signal according to a second clock signal.

Step S1330: Sample the second data signal to generate a third data signal according to the first clock signal.

Step S1340: Generate a phase detecting result according to the first data signal and the third data signal.

Those skilled in the art can readily understand how each step shown in FIG. 13 operates based on the abovementioned paragraphs related to the phase detector, and further description is omitted here for brevity.

Please note that, the steps of the abovementioned flowchart are merely a practicable embodiment of the present disclosure, and in no way should be considered to be limitations of the scope of the present disclosure. The method can include other intermediate steps or several steps can be merged into a single step without departing from the spirit of the present disclosure.

In summary, a phase detecting method, a related phase detector for executing such method, and a related clock-and-data recovery device with such build-in phase detector are provided in the present disclosure. By adopting two clock signals to sample the data input signal(s) for two times, not only can the problems of phase errors existed between clock signals be solved, but also the sampling edge of the clock signal(s) can be aligned to the center of the data input signal so as to obtain accurate sampled data. Furthermore, the amount of the exclusive OR gates used can be reduced. In addition, when the data input signal(s) is/are implemented by adopting a differential signal pair, the loading of data input signal(s) can be lowered decreased.

Those skilled in the art will readily observe that numerous modifications and alterations of the device and method may be made while retaining the teachings of the invention.

What is claimed is:

1. A phase detector, comprising:
    a first sampling unit, arranged for sampling a first data input signal to generate a first data signal according to a first clock signal;
    a second sampling unit, arranged for sampling a second data input signal to generate a second data signal according to a second clock signal;
    a third sampling unit, coupled to the second sampling unit, arranged for sampling the second data signal to generate a third data signal according to the first clock signal;
    a fourth sampling unit, coupled to the first sampling unit, for sampling the first data signal to generate a fourth data signal according to the second clock signal;
    a first phase determining module, coupled to the first sampling unit and the third sampling unit, arranged for generating a first phase detecting result according to the first data signal and the third data signal; and
    a second phase determining module, coupled to the second sampling unit and the fourth sampling unit, arranged for generating a second phase detecting result according to the second data signal and the fourth data signal.

2. The phase detector according to claim 1, wherein the first phase determining module comprises an exclusive OR gate (XOR), and the exclusive OR gate is arranged for performing an XOR logic operation upon the first data signal and the third data signal in order to generate the first phase detecting result.

3. The phase detector according to claim 1, wherein the first phase detecting result indicates a determining result of determining an advance of time for the first clock signal and the second clock signal.

4. The phase detector according to claim 1, wherein each of the first sampling unit, the second sampling unit, the third sampling unit, and the fourth sampling unit is a flip-flop.

5. The phase detector according to claim 1, wherein the first data input signal and the second data input signal are an identical data input signal.

6. The phase detector according to claim 1, wherein the first data input signal and the second data input signal are a differential signal pair.

7. The phase detector according to claim 1, wherein there is a phase shift of 45 degrees or 90 degrees existed between the first clock signal and the second clock signal.

8. The phase detector according to claim 1, wherein the second phase determining module comprises an exclusive OR gate, and the exclusive OR gate is arranged for performing an XOR logic operation upon the second data signal and the fourth data signal in order to generate the second phase detecting result.

9. The phase detector according to claim 1, wherein the second phase detecting result indicates a determining result of determining a delay of time for the first clock signal and the second clock signal.

10. A phase detecting method, comprising:
    sampling a first data input signal to generate a first data signal according to a first clock signal;
    sampling a second data input signal to generate a second data signal according to a second clock signal;
    sampling the second data signal to generate a third data signal according to the first clock signal;
    sampling the first data signal to generate a fourth data signal according to the second clock signal;
    generating a first phase detecting result according to the first data signal and the third data signal; and
    generating a second phase detecting result according to the second data signal and the fourth data signal.

11. The phase detecting method according to claim 10, wherein the step of generating the first phase detecting result according to the first data signal and the third data signal comprises:
    performing an XOR logic operation upon the first data signal and the third data signal in order to generate the first phase detecting result.

12. The phase detecting method according to claim 10, wherein the first phase detecting result indicates a determining result of determining an advance of time for the first clock signal and the second clock signal.

13. The phase detecting method according to claim 10, wherein the first data input signal and the second data input signal are an identical data input signal.

14. The phase detecting method according to claim 10, wherein the first data input signal and the second data input signal are a differential signal pair.

15. The phase detecting method according to claim 10, wherein there is a phase shift of 45 degrees or 90 degrees existed between the first clock signal and the second clock signal.

16. The phase detecting method according to claim 10, wherein the step of generating the second phase detecting result according to the second data signal and the fourth data signal comprises:
    performing an XOR logic operation upon the second data signal and the fourth data signal in order to generate the second phase detecting result.

17. The phase detecting method according to claim 10, wherein the second phase detecting result indicates a determining result of determining a delay of time for the first clock signal and the second clock signal.

18. A clock-and-data recovery device, comprising:
    a phase detector, comprising:
        a first sampling unit, arranged for sampling a first data input signal to generate a first data signal according to a first clock signal;
        a second sampling unit, arranged for sampling a second data input signal to generate a second data signal according to a second clock signal;
        a third sampling unit, coupled to the second sampling unit, arranged for sampling the second data signal to generate a third data signal according to the first clock signal;
        a fourth sampling unit, coupled to the first sampling unit, for sampling the first data signal to generate a fourth data signal according to the second clock signal;
        a first phase determining module, coupled to the first sampling unit and the third sampling unit, arranged for generating a first phase detecting result according to the first data signal and the third data signal; and
        a second phase determining module, coupled to the second sampling unit and the fourth sampling unit, arranged for generating a second phase detecting result according to the second data signal and the fourth data signal;
    a charge pump, coupled to the phase detector, arranged for generating a charge control signal according to the first and second phase detecting results;

a loop filter, coupled to the charge pump, arranged for generating an oscillator control signal according to the charge control signal; and a controlled oscillator, coupled to the charge pump and the loop filter, arranged for receiving the oscillator control signal, for compensating a plurality of frequencies of the first clock signal and the second clock signal, and for outputting a compensated first clock signal and a compensated second clock signal.

19. The clock-and-data recovery device according to claim 18, wherein the first phase determining module comprises an exclusive OR gate (XOR), and the exclusive OR gate is arranged for performing an XOR logic operation upon the first data signal and the third data signal in order to generate the first phase detecting result.

20. The clock-and-data recovery device according to claim 18, wherein the first phase detecting result indicates a determining result of determining an advance of time for the first clock signal and the second clock signal.

21. The clock-and-data recovery device according to claim 18, wherein each of the first sampling unit, the second sampling unit, the third sampling unit, and the fourth sampling unit is a flip-flop.

22. The clock-and-data recovery device according to claim 18, wherein the first data input signal and the second data input signal are an identical data input signal.

23. The clock-and-data recovery device according to claim 18, wherein the first data input signal and the second data input signal are a differential signal pair.

24. The clock-and-data recovery device according to claim 18, wherein there is a phase shift of 45 degrees or 90 degrees existed between the first clock signal and the second clock signal.

25. The clock-and-data recovery device according to claim 18, wherein the second phase determining module comprises an exclusive OR gate, and the exclusive OR gate is arranged for performing an XOR logic operation upon the second data signal and the fourth data signal in order to generate the second phase detecting result.

26. The clock-and-data recovery device according to claim 18, wherein the second phase detecting result indicates a determining result of determining a delay of time for the first clock signal and the second clock signal.

* * * * *